(12) United States Patent
Takahashi

(10) Patent No.: US 7,288,874 B2
(45) Date of Patent: *Oct. 30, 2007

(54) PIEZOELECTRIC ACTUATOR UNIT, MANUFACTURING METHOD THEREOF, PIEZOELECTRIC STRUCTURAL BODY, AND LIQUID EJECTING APPARATUS USING THE SAME

(75) Inventor: Tomoaki Takahashi, Nagano-Ken (JP)

(73) Assignee: Seiko Epson Corporation, Tokyo (JP)

( * ) Notice: Subject to any disclaimer, the term of this patent is extended or adjusted under 35 U.S.C. 154(b) by 225 days.

This patent is subject to a terminal disclaimer.

(21) Appl. No.: 10/676,254

(22) Filed: Oct. 2, 2003

(65) Prior Publication Data

US 2004/0227432 A1   Nov. 18, 2004

(30) Foreign Application Priority Data

Oct. 3, 2002 (JP) .............................. 2002-291457
Oct. 3, 2002 (JP) .............................. 2002-291470
Sep. 19, 2003 (JP) .............................. 2003-328580

(51) Int. Cl.
  *H01L 41/08* (2006.01)
(52) U.S. Cl. .................. 310/328; 310/366; 347/68; 347/70; 347/71
(58) Field of Classification Search .............. 310/328, 310/320, 365, 366; 347/68, 70, 71
  See application file for complete search history.

(56) References Cited

U.S. PATENT DOCUMENTS 6,274,966 B1* 8/2001 Kohno et al. ............... 310/328
6,747,396 B2* 6/2004 Blom ......................... 310/328
7,009,327 B2* 3/2006 Okazawa et al. ........... 310/331
7,114,798 B2* 10/2006 Takahashi .................... 347/72
2001/0017503 A1* 8/2001 Kitahara ..................... 310/328

FOREIGN PATENT DOCUMENTS

| JP | 07-132597 A | 5/1995 |
|---|---|---|
| JP | 7-156383 | 6/1995 |
| JP | 8-11304 A | 1/1996 |
| JP | 8-108534 A | 4/1996 |
| JP | 9-174837 A | 7/1997 |
| JP | 11-254683 A | 9/1999 |
| JP | 2000-117971 A | 4/2000 |
| JP | 2000-211125 A | 8/2000 |
| JP | 2001-71486 A | 3/2001 |
| JP | 2002-59547 A | 2/2002 |
| JP | 2002-234171 A | 8/2002 |

* cited by examiner

*Primary Examiner*—Thomas M. Dougherty
(74) *Attorney, Agent, or Firm*—Sughrue Mion, PLLC

(57) ABSTRACT

The present invention is a piezoelectric actuator unit 29 having piezoelectric vibrators 33 vibrating in the lamination direction of electrode layers and piezoelectric material layers which are alternately laminated. The piezoelectric vibrators are arranged in one row in the direction of vibrator arrangement perpendicular to the lamination direction. Each of the piezoelectric vibrators includes the area on one side and the area on the other side in the direction of the vibrator width perpendicular to the lamination and vibrator arrangement directions, and either of the area on one side and the area on the other side forms active parts capable of performing piezoelectric deformation, and the other area forms inactive parts incapable of performing piezoelectric deformation, and in the adjacent piezoelectric vibrators, the arrangement of the active part and inactive part is opposite. According to the present invention, the number of nozzles of the liquid ejecting apparatus can be increased without any inconveniences.

9 Claims, 10 Drawing Sheets

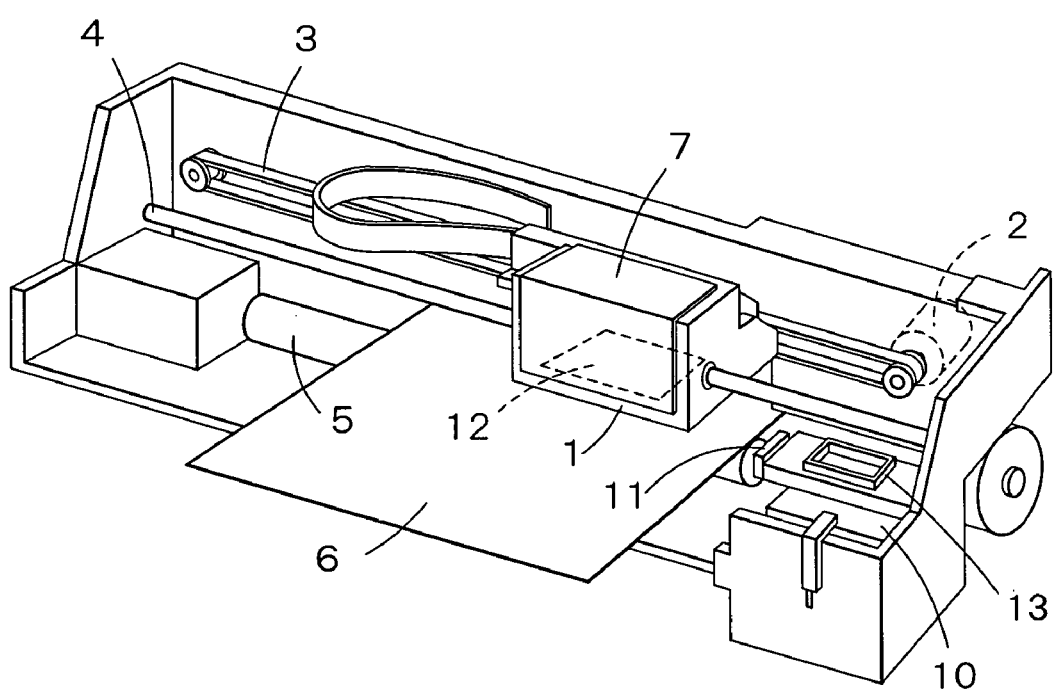
F I G. 1

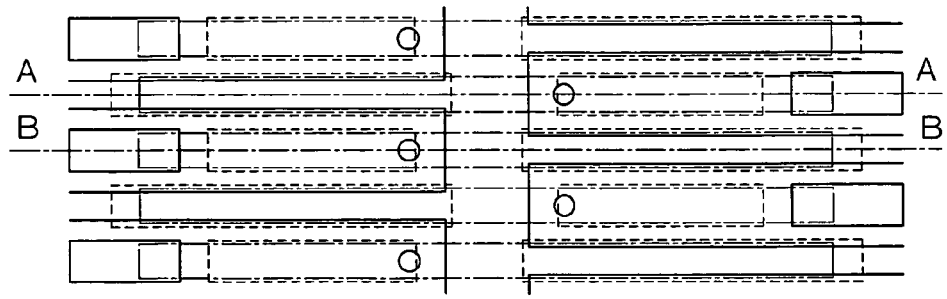
F I G. 6
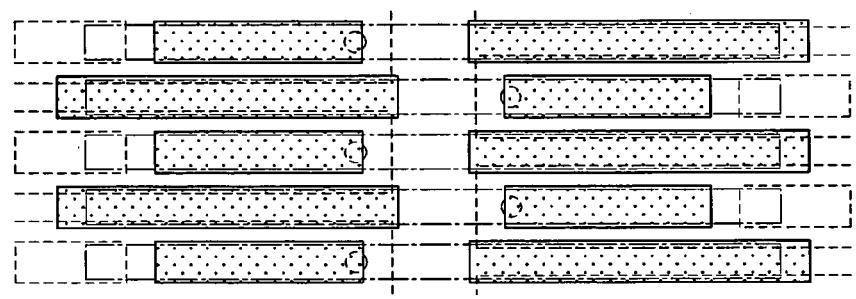
F I G. 7
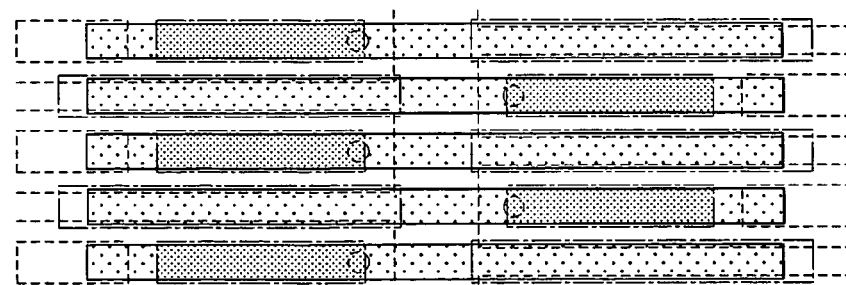
F I G. 8

F I G. 15A
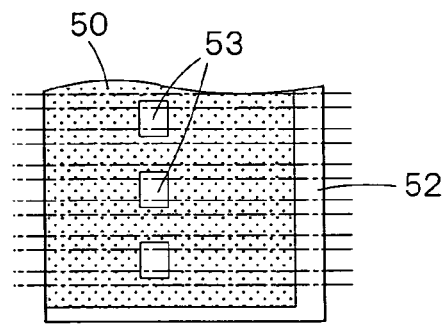
F I G. 15B
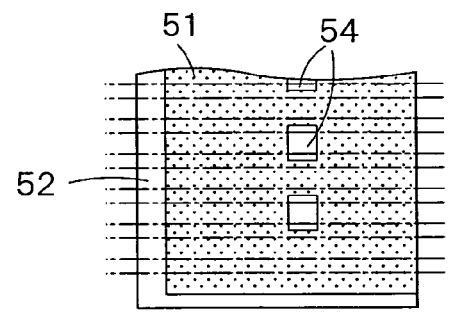
F I G. 16A
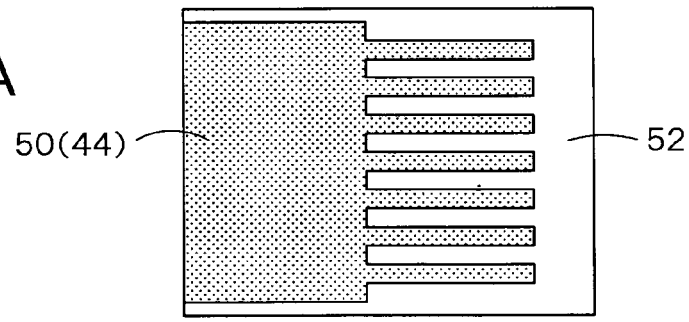
F I G. 16B
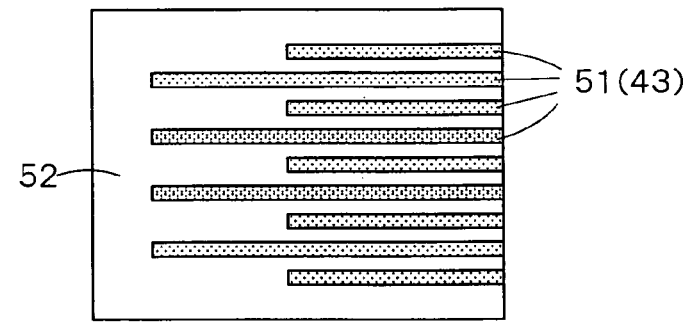

PIEZOELECTRIC ACTUATOR UNIT, MANUFACTURING METHOD THEREOF, PIEZOELECTRIC STRUCTURAL BODY, AND LIQUID EJECTING APPARATUS USING THE SAME

BACKGROUND OF THE INVENTION

1. Field of the Invention

The present invention relates to a piezoelectric actuator unit having a piezoelectric vibrator, a manufacturing method thereof, and a piezoelectric structural body to be used to manufacture the piezoelectric actuator unit. The piezoelectric actuator unit, for example, is suitably used as a part of a liquid ejecting head and a micro-pump. Here, the liquid ejecting head ejects liquid drops from a nozzle opening thereof. For example, there are a recording head used for an image recording apparatus such as a printer, a liquid crystal ejecting head used to manufacture a liquid crystal display, and a coloring material ejecting head used to manufacture a color filter available. Further, the micro-pump is a microminiature pump capable of handling a very small amount of liquid.

Further, the present invention relates to a liquid ejecting apparatus for ejecting liquid drops from a nozzle opening thereof. As a typical example of a conventional liquid ejecting apparatus, there is an ink jet recording apparatus having an ink jet recording head for image recording available. As other liquid ejecting apparatuses, for example, an apparatus having a coloring material ejecting head used to manufacture a color filter of a liquid crystal display, an apparatus having an electrode material (conductive paste) ejecting head used for electrode forming of an organic EL display and a face emission display (FED), an apparatus having a biological organic matter ejecting head used to manufacture biological chips, and an apparatus having a sample ejecting head as a precise pipette may be cited.

2. Description of Related Art

As an apparatus using a piezoelectric actuator unit having a piezoelectric vibrator, there is a liquid ejecting apparatus. An ink jet recording apparatus which is a typical example of the same produces a comparatively low noise during printing and can form small dots at high density, so that it has been used recently in many printings including color printing.

The ink jet recording apparatus generally has an ink jet recording head (liquid ejecting head) which is loaded on a carriage and moves back and forth in the width direction (head scanning direction) of a recording medium such as recording paper and a feed means for moving the recording medium in the direction (medium feed direction) perpendicular to the head scanning direction.

In this ink jet recording apparatus, ink drops (liquid drops) are ejected from the recording head to the recording medium in correspondence to print data to print the same. And, the recording head loaded on the carriage is formed so as to eject ink of colors such as black, yellow, cyan, and magenta, thus not only text printing by black ink but also by changing the 4-color-ink ejection rate, full-color printing can be carried out.

FIG. 18 is a sectional view showing an example of the recording head of a conventional ink jet recording apparatus.

A recording head 162 has a case 163 made of synthetic resin and a flow path unit 164 stuck on the front (the left side of the drawing) of the case 163. And, the flow path unit 164 is formed by laminating a nozzle plate 166 having many bored nozzle openings 165, a flow path forming plate 168, an elastic plate 176, and a vibration plate 167.

The case 163 is a block member having a storing space 169 opened on the front and rear thereof. In the storing space 169, a piezoelectric vibrator 161 fixed to a fixing substrate 170 is stored. The piezoelectric vibrator 161 has a longitudinal vibration mode.

The nozzle plate 166 is a thin laminal member that many nozzle openings 165 are bored in line along the sub-scanning direction. The respective nozzle openings 165 are arranged at a predetermined pitch according to the dot forming density. By the vibration plate 167 and the elastic plate 176, an insular thick part 171 with the tip of the piezoelectric vibrator 161 joined and a thin elastic part 172 installed so as to surround the periphery of the thick part 171 are formed. On the flow path forming plate 168, a pressure chamber 173, a common ink chamber 174, and an ink feed port 175 for interconnecting the pressure chamber 173 and the common ink chamber 174 are formed.

And, the nozzle plate 166 is arranged in front of the flow path forming plate 168, and the vibration plate 167 and the elastic plate 176 are arranged on the rear side, and the nozzle and vibration plates 166, 167 and the elastic plate 176 are integrated by adhesion so as to sandwich the flow path forming plate 168 between them, thus the flow path unit 164 is formed.

The tip of the piezoelectric vibrator 161 is joined to the thick part 171 on the rear side and in this state, the piezoelectric vibrator 161 is fixed to the case 163. Further, to the piezoelectric vibrator 161, a flexible cable 177 is connected and via the flexible cable 177, a drive signal (COM) and print data(SI) are supplied.

The piezoelectric vibrator 161 in the longitudinal vibration mode shown in FIG. 18 has a characteristic that when it is charged, it is constricted perpendicularly to the electric field and when it is discharged, it is extended perpendicularly to the electric field. Therefore, in the recording head 162, when the piezoelectric vibrator 161 is charged, it is constricted backward, and the thick part 171 is pulled backward in correspondence with constriction, and the constricted pressure chamber 173 is expanded. In correspondence with the expansion, ink in the common ink chamber 174 flows in the pressure chamber 173 via the ink feed port 175. On the other hand, when the piezoelectric vibrator 161 is discharged, it is extended forward, and the thick part 171 is pressed forward, and the pressure chamber 173 is contracted. In correspondence with this contraction, the ink pressure in the pressure chamber 173 is increased and ink drops are ejected from the nozzle opening 165.

Meanwhile, in the ink jet recording apparatus, to improve the print image quality or to increase the printing speed, it is desirable to reduce the nozzle pitch of the recording head and increase the nozzle density.

However, in the recording head using a conventional piezoelectric actuator unit shown in FIG. 18, to reduce the nozzle pitch and increase the nozzle density higher than the current one is extremely difficult due to the restrictions with respect to manufacturing.

In the recording head, to reduce the nozzle pitch thereof is to simultaneously reduce the pitch of the pressure chambers and when the pitch of the pressure chambers is reduced like this, the gap between the insular thick part formed above the pressure chambers and the partitions of the pressure chambers are narrowed. This results in causing an increase in the reaction force when the piezoelectric vibrator is driven and making the cross talk during printing worse and peeling-off of the member forming the recording head.

As mentioned above, there is a limit to improvement of the nozzle density (reduction in the nozzle pitch), so that there is a method of increasing the number of nozzle rows instead of increasing the number of nozzles in one row, thereby increasing the total number of nozzle openings formed in one recording head.

However, in the constitution of a conventional recording head, the number of piezoelectric actuator units must be increased according to an increase in the number of nozzle rows. Generally, one piezoelectric actuator unit is manufactured from one laminate bulk composed of laminated piezoelectric material layers and electrode layers. Therefore, laminate bulks as many as the number of piezoelectric actuator units to be manufactured is necessary, thus the manufacturing cost is inevitably increased. Further, generally, when assembling a recording head, it must be wired (tape carrier package, etc.) for each piezoelectric actuator unit, so that the number of necessary wires is increased in correspondence with an increase in the number of piezoelectric actuator units, thus the manufacturing process is complicated and the neighborhood of the recording head is complicated.

Further, an art for forming two piezoelectric vibrator rows from one laminate bulk is proposed (Japanese Patent Laid-Open Publication No. 8-11304). However, the art forms a slit in the center of the laminate bulk to isolate the piezoelectric vibrator rows, so that for example, regarding laying of wires, after all, similarly to the constitution of installing two separate piezoelectric actuator units, the wiring is inevitably complicated.

SUMMARY OF THE INVENTION

The present invention was developed with the foregoing in view and is intended to provide mainly a piezoelectric actuator unit capable of providing a liquid ejecting head capable of increasing the number of nozzles free of an increase in the cross talk, peeling-off of an adhesive, and moreover an excessive increase in the manufacturing cost, and complication of wiring, a manufacturing method thereof, and a piezoelectric structural body used for the manufacture and to provide a liquid ejecting apparatus having a liquid ejecting head using the same.

The present invention is a piezoelectric actuator unit comprising: a plurality of piezoelectric vibrators formed by alternately laminating electrode layers and piezoelectric material layers so as to vibrate in a lamination direction of said layers, wherein: said plurality of piezoelectric vibrators are arranged in one row in a direction of vibrator arrangement perpendicular to said lamination direction, each piezoelectric vibrator includes an area on one side and an area on the other side in a vibrator width direction perpendicular to both said lamination direction and said vibrator arrangement direction, either of said area on one side and said area on the other side forms an active part capable of performing piezoelectric deformation, and the other area forms an inactive part incapable of performing piezoelectric deformation, an arrangement of said active part and said inactive part is opposite between adjacent piezoelectric vibrators, each piezoelectric vibrator has an individual electrode layer on a drive voltage input side, and all of said individual electrode layers of said plurality of piezoelectric vibrators are exposed on one side of said piezoelectric actuator unit in said vibrator width direction.

Preferably, said plurality of piezoelectric vibrators respectively further include common electrode layers on a reference potential side, and all of said common electrode layers of said plurality of piezoelectric vibrators are exposed on the other side of said piezoelectric actuator unit in said vibrator width direction.

Preferably, the piezoelectric actuator unit further comprises external drive means configured to drive said plurality of piezoelectric vibrators, and all of said individual electrode layers of said plurality of piezoelectric vibrators are electrically connected to said external drive means on one side of said piezoelectric actuator unit.

Preferably, the piezoelectric actuator unit further comprises: a plurality of individual external electrodes which are exposed on one side of said piezoelectric actuator unit and electrically connected to respective said individual electrode layers of said plurality of piezoelectric vibrators, and a common external electrode which is exposed on the other side of said piezoelectric actuator unit and electrically connected to all of said common electrode layers of said plurality of piezoelectric vibrators, wherein said common external electrode is pulled out on the same side as that of said individual external electrodes.

Preferably, via an inactive wall incapable of performing piezoelectric deformation and extending overall in said vibrator width direction between said piezoelectric vibrators, said plurality of piezoelectric vibrators are integrally formed without being separated from each other.

Preferably, respective said plurality of piezoelectric vibrators are formed independently, and said plurality of piezoelectric vibrators are integrally fixed by a fixing substrate arranged on one side of said actuator unit in the lamination direction.

Preferably, said fixing substrate is formed by free-cutting ceramics.

Preferably, the piezoelectric actuator unit further comprises a piezoelectric actuator unit substrate for holding said fixing substrate.

Preferably, the piezoelectric actuator unit further comprises a tape carrier package electrically connected to said electrode layers of said plurality of piezoelectric vibrators, wherein said tape carrier package includes an integrated circuit for driving said plurality of piezoelectric vibrators, and a rear of said integrated circuit is at least partially fixed to said piezoelectric actuator unit substrate.

The present invention is a method of manufacturing a piezoelectric actuator unit structured by arranging a plurality of piezoelectric vibrators formed by alternately laminating electrode layers and piezoelectric material layers so as to vibrate in a lamination direction of said layers, comprising: a lamination step of forming a laminate by alternately laminating a first conductive material layer for forming common electrode layers of said plurality of piezoelectric vibrators on a reference potential side and a second conductive material layer for forming individual electrode layers of said plurality of piezoelectric vibrators on a drive voltage input side while sandwiching a piezoelectric material layer between said first conductive material layer and said second conductive material layer, wherein: in said first conductive material layer, a plurality of first windows are formed so as to be arranged at a predetermined pitch to form a first window row along said vibrator arrangement direction, in said second conductive material layer, a plurality of second windows are formed so as to be arranged at said predetermined pitch to form a second window row parallel with said first window row, and said first windows and said second windows are staggered from each other at a pitch which is a half of said predetermined pitch in said vibrator arrangement direction.

Preferably, the method of manufacturing a piezoelectric actuator unit further comprises a step of joining a fixing substrate to one face of said laminate in said lamination direction.

Preferably, the method of manufacturing a piezoelectric actuator unit further comprises: a step of forming a second external conductive material layer to be connected to said second conductive material layer on one face of said laminate in a vibrator width direction perpendicular to said lamination direction and said vibrator arrangement direction, and a step of forming a first external conductive material layer to be connected to said first conductive material layer on the other face of said laminate in said vibrator width direction and pulling out and extending said first external conductive material layer up to one face of said laminate in which said second external conductive material layer is formed passing through a face of said fixing substrate opposite to a face of said fixing substrate to which said laminate is joined.

Preferably, the method of manufacturing a piezoelectric actuator unit further comprises a step of forming a plurality of notches in said laminate in said lamination direction, thereby forming said plurality of piezoelectric vibrators, each of said plurality of notches being formed so as to cover both each end of said first windows and each end of said second windows in said vibrator arrangement direction.

Preferably, said first conductive material layer or said second conductive material layer is also formed on an end face of said laminate corresponding to tips of said plurality of piezoelectric vibrators.

Preferably, the method of manufacturing a piezoelectric actuator unit further comprises a step of electrically connecting external drive means configured to drive said plurality of piezoelectric vibrators to all of said individual electrode layers of said plurality of piezoelectric vibrators on one face of said laminate.

The present invention is a piezoelectric structural body used for manufacturing a piezoelectric actuator unit structured by arranging a plurality of piezoelectric vibrators formed by alternately laminating electrode layers and piezoelectric material layers so as to vibrate in a lamination direction of said layers, comprising: a laminate formed by alternately laminating a first conductive material layer for forming common electrode layers of said plurality of piezoelectric vibrators on a reference potential side and a second conductive material layer for forming individual electrode layers of said plurality of piezoelectric vibrators on a drive voltage input side while sandwiching a piezoelectric material layer between said first conductive material layer and said second conductive material layer, wherein: in said first conductive material layer, a plurality of first windows are formed so as to be arranged at a predetermined pitch to form a first window row along said vibrator arrangement direction, and in said second conductive material layer, a plurality of second windows are formed so as to be arranged at said predetermined pitch to form a second window row parallel with said first window row, and said first windows and said second windows are staggered from each other at a pitch which is a half of said predetermined pitch in said vibrator arrangement direction.

Preferably, the piezoelectric structural body further comprising a fixing substrate joined to one face of said laminate in said lamination direction.

Preferably, the piezoelectric structural body further comprises: a second external conductive material layer which is formed on one face of said laminate in a vibrator width direction perpendicular to said lamination direction and said vibrator arrangement direction and connected to said second conductive material layer, and a first external conductive material layer which is formed on the other face of said laminate in said vibrator width direction and connected to said first conductive material layer and pulled out and extended up to one face of said laminate in which said second external conductive material layer is formed passing through a face of said fixing substrate opposite to a face of said fixing substrate to which said laminate is joined.

Preferably, by a plurality of notches formed in said laminate in said lamination direction, said plurality of piezoelectric vibrators are formed, and said plurality of notches are respectively formed so as to cover both each end of said first windows and each end of said second windows in said vibrator arrangement direction.

Preferably, said first conductive material layer or said second conductive material layer is also formed on an end face of said laminate corresponding to tips of said plurality of piezoelectric vibrators.

Preferably, the piezoelectric structural body further comprising external drive means configured to drive said plurality of piezoelectric vibrators and connected to all of said individual electrode layers of said plurality of piezoelectric vibrators on one face of said laminate.

The present invention is a liquid ejecting apparatus including a liquid ejecting head having a nozzle forming face in which a plurality of nozzle openings for ejecting liquid drops are formed in line at a predetermined pitch, wherein: said liquid ejecting head has a plurality of pressure chambers respectively interconnected to said plurality of nozzle openings, a plurality of elastic walls forming one face of each of said plurality of pressure chambers, and a piezoelectric actuator unit configured to deform said elastic walls to change volume of said pressure chambers, said plurality of nozzle openings and said plurality of pressure chambers are arranged in a first row and a second row which are parallel with each other, and said nozzle openings and said pressure chambers belonging to said first row and said nozzle openings and said pressure chambers belonging to said second row are staggered from each other at a pitch which is a half of said predetermined pitch, and said piezoelectric actuator unit has a plurality of piezoelectric vibrators arranged in one row at a pitch which is a half of said predetermined pitch in correspondence with said plurality of pressure chambers, said plurality of piezoelectric vibrators respectively include active parts capable of performing piezoelectric deformation corresponding to said pressure chambers belonging to said first row or said second row and inactive parts incapable of performing piezoelectric deformation corresponding to partitions for isolating said pressure chambers belonging to said second row or said first row, an arrangement of said active part and said inactive part is opposite between adjacent piezoelectric vibrators, and said piezoelectric vibrators respectively have an individual electrode layer on a drive voltage input side, and all of said individual electrode layers of said plurality of piezoelectric vibrators are exposed on one side of said piezoelectric actuator unit in said vibrator width direction.

Preferably, said piezoelectric vibrators are formed by laminating piezoelectric material layers and electrode layers perpendicularly to said nozzle forming face, and said piezoelectric vibrators vibrate in an lamination direction of said piezoelectric material layers and said electrode layers.

Preferably, all of said plurality of piezoelectric vibrators and an external drive source are electrically connected on one side of said piezoelectric actuator unit.

Preferably, the liquid ejecting apparatus further comprises: a plurality of said piezoelectric actuator units, and a plurality of sets composed of said first row and said second row formed by said plurality of nozzle openings and said plurality of pressure chambers, wherein said piezoelectric actuator unit is arranged in each of said sets composed of said first row and said second row.

Preferably, said plurality of elastic walls are composed of a part of an elastic plate covering all of said plurality of pressure chambers, and a face of said elastic plate on a side of said piezoelectric actuator unit is joined only to said piezoelectric actuator unit around each of said plurality of elastic walls.

Preferably, a plurality of insular movable thick parts which are respectively formed in correspondence with said plurality of pressure chambers and to which respective said active parts of said plurality of piezoelectric vibrators are joined and a plurality of insular fixed thick parts which are formed in correspondence with said partitions for isolating said plurality of pressure chambers and to which respective said inactive parts of said plurality of piezoelectric vibrators are joined are installed on said face of said elastic plate on said side of said piezoelectric actuator unit.

Preferably, a plurality of insular movable thick parts which are respectively formed in correspondence with said plurality of pressure chambers and to which respective said active parts of said plurality of piezoelectric vibrators are joined, a plurality of peninsular fixed thick parts which are formed in correspondence with said partitions for isolating said plurality of pressure chambers and to which respective said inactive parts of said plurality of piezoelectric vibrators are joined, first thick bases for connecting said peninsular fixed thick parts corresponding to said first row, and second thick bases for connecting said peninsular fixed thick parts corresponding to said second row are installed on said face of said elastic plate on said side of said piezoelectric actuator unit.

Preferably, said first thick bases and said second thick bases are arranged on a side opposite to a side where said nozzle openings are formed with respect to said pressure chambers.

Preferably, a length of said insular fixed thick part or said peninsular fixed thick part formed in correspondence with said partition is longer than a length of said insular movable thick part formed in correspondence with said pressure chamber.

Preferably, said elastic walls have parts corresponding to said insular movable thick parts and compliance parts formed around said insular movable thick parts, and an outer contours of said compliance part, in an arrangement direction of said plurality of nozzle openings, are defined by said insular fixed thick parts or said peninsular fixed thick parts formed in correspondence with said partitions and, in a direction perpendicular to the arrangement direction of said plurality of nozzle openings, are defined by a part of side walls forming said pressure chambers and ink feed ports of said pressure chambers.

Preferably, said piezoelectric vibrators are formed by laminating piezoelectric material layers and electrode layers perpendicularly to said nozzle forming face, said piezoelectric vibrators vibrate in a lamination direction of said piezoelectric material layers and said electrode layers, and via an inactive wall incapable of performing piezoelectric deformation extending overall in said vibrator width direction between said piezoelectric vibrators, said plurality of piezoelectric vibrators are integrally formed without being separated from each other.

As mentioned above, according to the present invention, free of an increase in the cross talk, peeling-off of an adhesive, and moreover an excessive increase in the manufacturing cost, and complication of wiring, the number of nozzles of the liquid ejecting head can be increased.

Further, according to the present invention, a drive signal can be supplied to all of the plurality of piezoelectric vibrators from one side of the piezoelectric actuator unit, so that the complication of wiring due to an increase in the number of nozzles can be avoided.

BRIEF DESCRIPTION OF THE DRAWINGS

The foregoing and other objects and features and advantages of the present invention will be understood from the following detailed description in connection with the accompanying drawings.

FIG. 1 is a perspective view showing a rough constitution of an ink jet recording apparatus as a liquid ejecting apparatus using a piezoelectric actuator unit of an embodiment of the present invention;

FIG. 6 is a drawing showing the arrangement constitution of the nozzle openings, pressure chambers, and ink flow path of the recording head shown in FIG. 2;

FIG. 7 is a drawing showing the arrangement constitution of the movable thick parts and fixed thick parts of the recording head shown in FIG. 2;

FIG. 8 is a drawing showing the arrangement constitution of the piezoelectric vibrators of the recording head shown in FIG. 2;

FIG. 15A is a drawing for explaining the manufacturing method of a piezoelectric actuator unit of an embodiment of the present invention, showing the relationship of the forming position of the notches shown in FIG. 14 and the windows of the first conductive material layer;

FIG. 15B is a drawing for explaining the manufacturing method of a piezoelectric actuator unit of an embodiment of the present invention, showing the relationship of the forming position of the notches shown in FIG. 14 and the windows of the second conductive material layer;

FIG. 16A is a drawing for explaining a piezoelectric actuator unit as a modified example of the embodiment shown in FIG. 14, showing the pattern of the first conductive material layer 50 constituting the common electrode layers 44 on the reference potential side;

FIG. 16B is a drawing for explaining a piezoelectric actuator unit as a modified example of the embodiment shown in FIG. 14, showing the pattern of the second conductive material layer 51 constituting the individual electrode layers 43 on the drive voltage input side;

DESCRIPTION OF THE PREFERRED EMBODIMENTS

Figure 2:
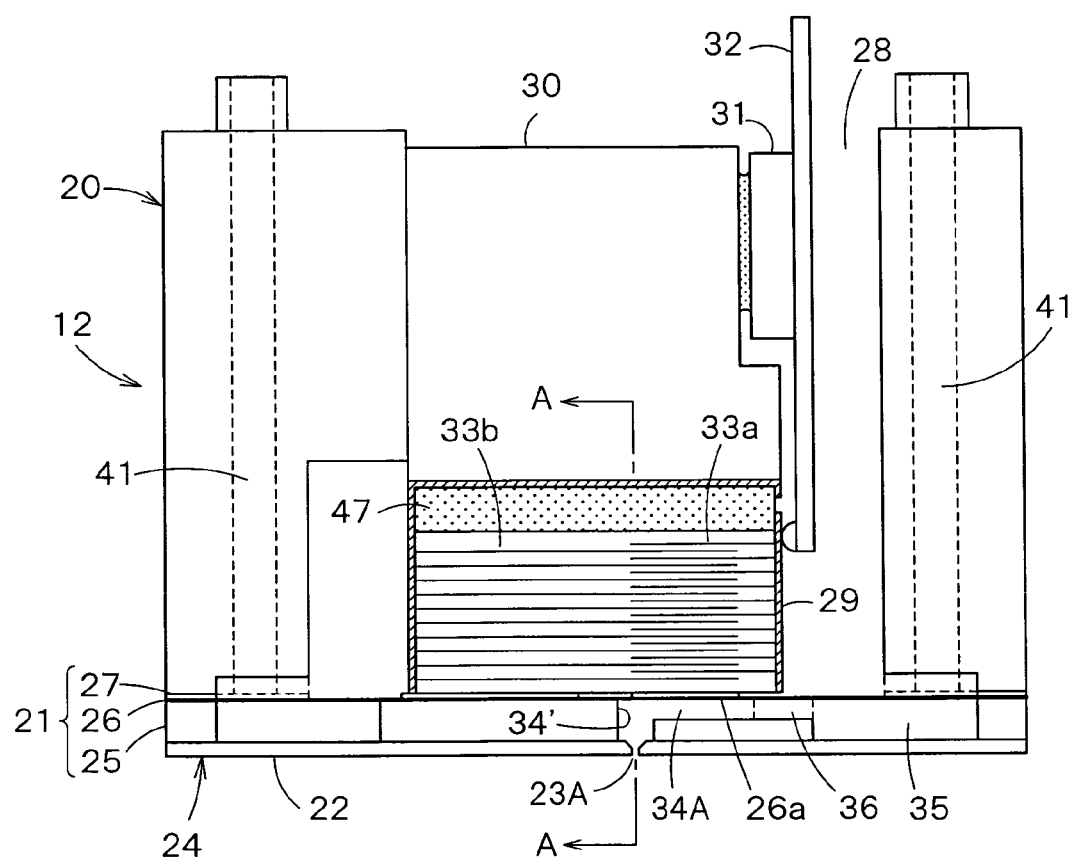
FIG. 2 is a vertical sectional view showing the enlarged recording head of the ink jet recording apparatus shown in FIG. 1.

An ink jet recording apparatus as a liquid ejecting apparatus having a piezoelectric actuator unit of an embodiment of the present invention will be explained below with reference to the accompanying drawings.

FIG. 1 is a perspective view showing a rough constitution of an ink jet recording apparatus using the piezoelectric actuator unit of the present embodiment. In FIG. 1, numeral 1 indicates a carriage and the carriage 1 is structured so as to be guided by a guide member 4 via a timing belt 3 driven by a carriage motor 2 and move back and forth in the axial direction of a platen 5. The platen 5 supports recording paper 6 (a kind of recording medium) from the rear thereof and defines the position of the recording paper 6 with respect to an ink jet recording head (liquid ejecting head) 12.

The carriage 1, the carriage motor 2, the timing belt 3, and the guide member 4 form the carriage mechanism for allowing the recording head 12 to scan in the head scanning direction together with the carriage 1.

The recording head 12 is loaded on the side opposite to the recording paper 6 of the carriage 1. On the carriage 1, an ink cartridge 7 for feeding ink to the recording head 12 is mounted in a removable state.

In the home position (the right side of FIG. 1) which is a non-printing area of the ink jet recording apparatus, a cap member 13 is arranged and the cap member 13 is structured so as to be pressed to the nozzle forming face of the recording head 12 and form a closed space between the recording head 12 and the nozzle forming face, when the recording head 12 loaded on the carriage 1 moves to the home position. And, under the cap member 13, a suction pump 10 for giving negative pressure to the closed space formed by the cap member 13 is arranged.

In the neighborhood of the cap member 13 on the printing area side, a wiping member 11 composed of an elastic plate (elastic blade) such as rubber is arranged so as to move back and forth, for example, horizontally for the moving track of the recording head 12 and is structured so as to wipe out the nozzle forming face of the recording head 12 as required, when the carriage 1 is to move from the side of the cap member 13 to the printing area side.

The ink jet recording apparatus further has a medium feeding mechanism for intermittently feeding the recording paper 6 to be printed (recorded) by the recording head 12 in the medium feeding direction perpendicular to the head scanning direction.

Next, by referring to FIGS. 2 to 8, the ink jet recording head (liquid ejecting head) 12 using the piezoelectric actuator unit of this embodiment will be described in detail.

Figure 3:
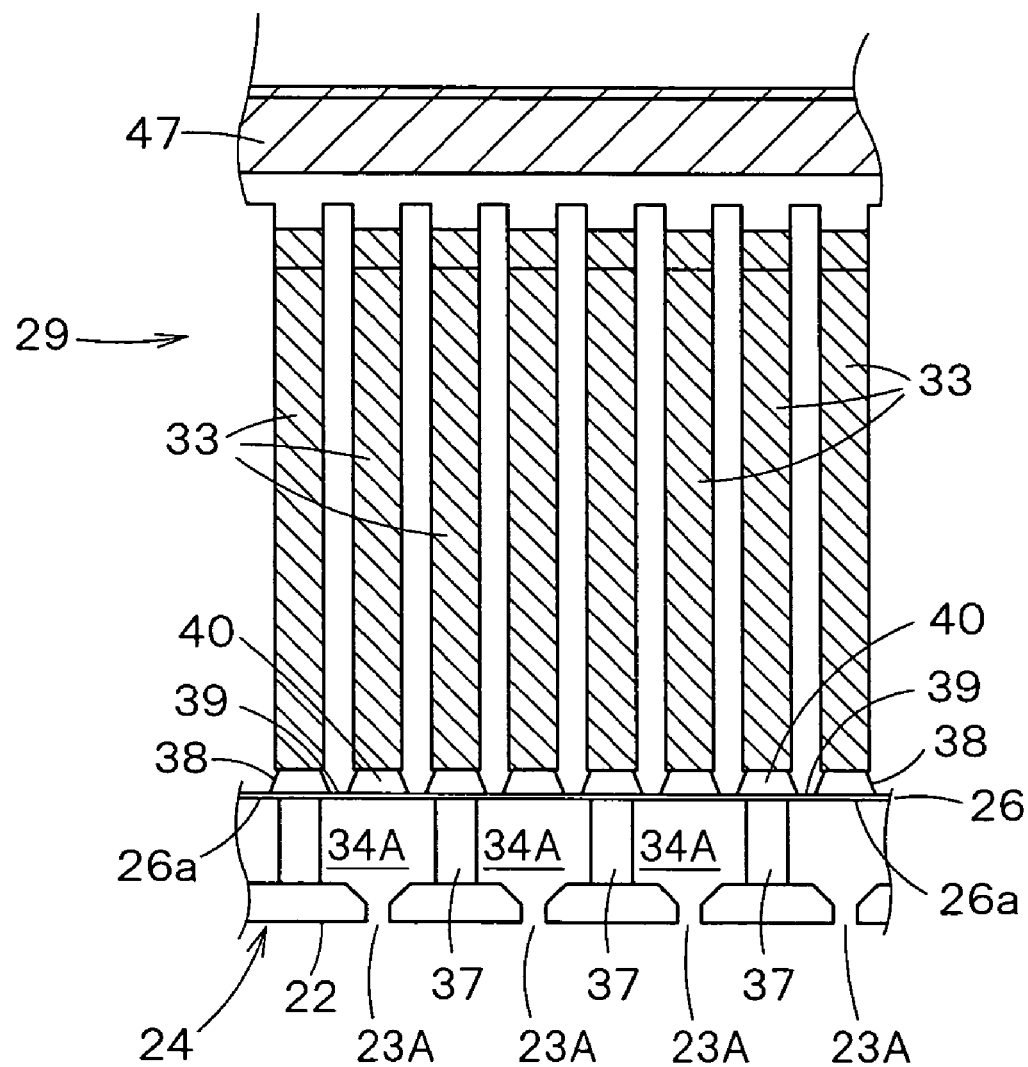
FIG. 3 is a sectional view of the line A-A shown in FIG. 1.

As shown in FIG. 2 and FIG. 3 which is the sectional view of the line A-A shown in FIG. 2, the recording head 12 has a case 20 made of synthetic resin and a flow path unit 21 stuck on the bottom of the case 20. The flow path unit 21 is formed by laminating a nozzle plate 24 having many bored nozzle openings 23A and 23B (in FIGS. 2 and 3, only 23A is shown), a flow path forming plate 25, an elastic plate 26, and a vibration plate 27 and unifying them by adhesion. The nozzle plate 24 is a thin laminal member in which many nozzle openings 23A and 23B are bored in the sub-scanning direction and the bottom of the nozzle plate 24 forms a nozzle forming face 22.

The case 20 is a block member in which a storing space 28 opened on the top and bottom is formed. In the storing space 28, a piezoelectric actuator unit 29 of an embodiment of the present invention and a piezoelectric actuator unit substrate 30 attached on the top thereof are stored.

To the piezoelectric actuator unit 29, a tape carrier package 32 having a drive integrated circuit 31 is electrically connected. One face of the drive integrated circuit 31 is stuck to the piezoelectric actuator unit substrate 30, thus a cooling effect for the drive integrated circuit 31 is obtained.

The piezoelectric actuator unit 29 has a plurality of piezoelectric vibrators 33 arranged in one row. The piezoelectric vibrators 33 are composed of electrode layers and piezoelectric material layers which are alternately laminated in the direction perpendicular to the nozzle forming face 22, vibrate in the lamination direction of both layers, and have a piezoelectric strain constant d33. The piezoelectric vibrators 33 have an active part 33a capable of performing piezoelectric deformation and an inactive part 33b incapable of performing piezoelectric deformation.

On the flow path forming plate 25, a plurality of pressure chambers 34A and 34B (in FIGS. 2 and 3, only 34A is shown), a common ink chamber 35 formed for each ink kind, and an ink feed port 36 for interconnecting the pressure chambers 34A and 34B and the common ink chamber 35 for each of the pressure chambers 34A and 34B are formed. The pressure chambers 34A (34B) are isolated by a partition 37. The top opening of each of the pressure chambers 34A and 34B is sealed by an elastic wall 26a composed of a part of the single elastic plate 26. The elastic wall 26a is deformed according to deformation of the piezoelectric vibrators of the piezoelectric actuator unit 29, thereby the volume of the pressure chambers 34A and 34B can be changed.

Insular movable thick parts 38 on which the tips of the active parts 33*a* (FIGS. 4 and 5) of the piezoelectric vibrators 33 are joined, elastic thin parts (compliance parts) 39 formed so as to surround the movable thick parts 38, and insular fixed thick parts 40 formed in correspondence with the partitions 37 to which the tips of the inactive parts 33*b* (FIGS. 4 and 5) of the piezoelectric vibrators 33 are joined are formed by the elastic plate 26 and vibration plate 27.

On the case 20, an ink feed path 41 for feeding ink to the common ink chamber 35 is formed for each ink kind. The ink feed path 41 passes through the elastic plate 26 and the vibration plate 27 and is interconnected to the common ink chamber 35.

Figure 4:
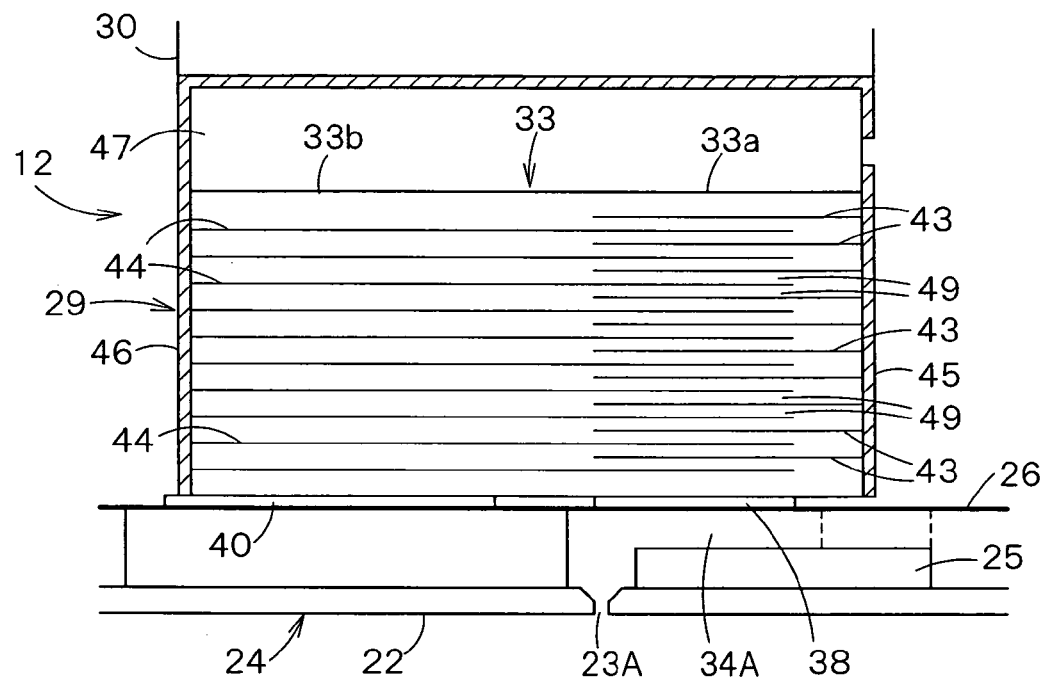
FIG. 4 is a vertical sectional view including the nozzle openings in the first row of the recording head shown in FIG. 2 and is a sectional view of the line A-A shown in FIG. 6.
Figure 5:
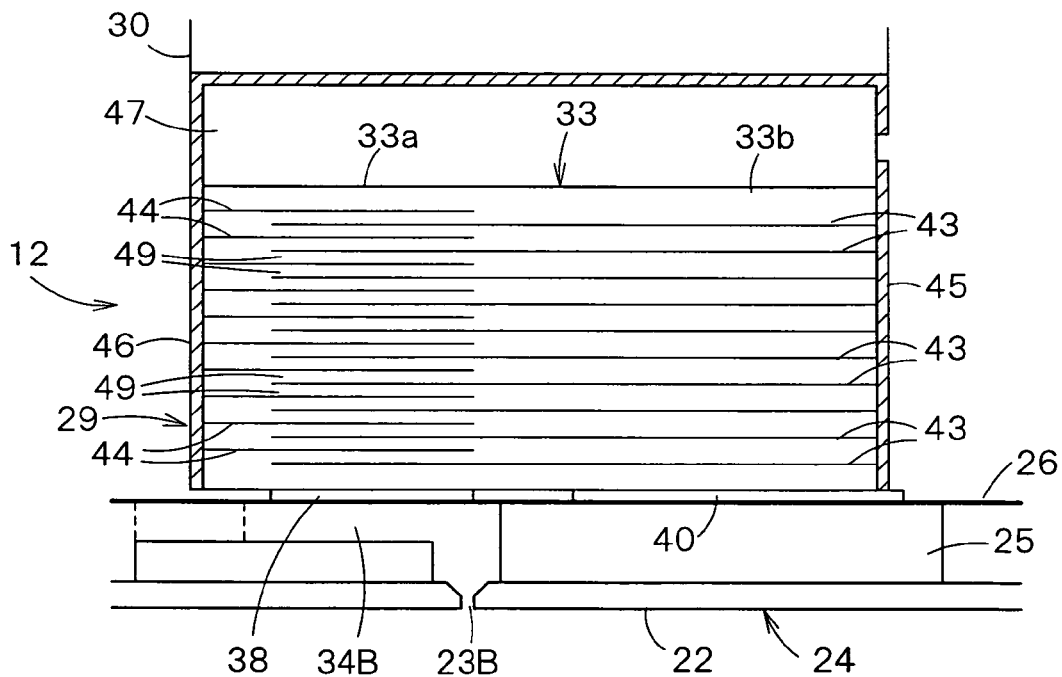
FIG. 5 is a vertical sectional view including the nozzle openings in the second row of the recording head shown in FIG. 2 and is a sectional view of the line B-B shown in FIG. 6.

The ink jet recording head using the piezoelectric actuator unit of this embodiment has two nozzle rows parallel with each other which are composed of many nozzle openings 23A and 24B arranged at a predetermined pitch. FIG. 4 is a vertical sectional view including the nozzle openings 23A in the first row and FIG. 5 is a vertical sectional view including the nozzle openings 23B in the second row. Further, FIG. 6 is a drawing showing the arrangement constitution of the nozzle openings 23A and 23B, the pressure chambers 34A and 34B, and the ink flow path, and FIG. 7 is a drawing showing the arrangement constitution of the movable thick parts 38 and the fixed thick parts 40, and FIG. 8 is a drawing showing the arrangement constitution of the piezoelectric vibrators 33. Further, FIG. 4 is a sectional view of the line A-A shown in FIG. 6 and FIG. 5 is a sectional view of the line B-B shown in FIG. 6.

As FIG. 6 shows, the nozzle openings 23A and pressure chambers 34A belonging to the first row and the nozzle openings 23B and pressure chambers 34B belonging to the second row are staggered from each other at a pitch which is a half of a predetermined pitch between the nozzle openings 23A (or 23B).

Further, as FIGS. 3 and 8 show, the piezoelectric actuator unit 29 has a plurality of piezoelectric vibrators 33 arranged in one row at a pitch which is a half of the predetermined pitch (nozzle pitch) between the nozzle openings 23A (or 23B) in correspondence with a plurality of pressure chambers 34A and 34B.

And, as shown in FIGS. 4 and 5, each of the plurality of piezoelectric vibrators 33 arranged in parallel in the vibrator arrangement direction (the direction perpendicular to the paper surface of each of FIGS. 4 and 5) perpendicular to the lamination direction of electrode layers 43 and 44 and piezoelectric material layers 49 includes a half on one side and a half on the other side in the vibrator width direction (the lateral direction of FIGS. 4 and 5) perpendicular to both the lamination direction and vibrator arrangement direction, and the half on either of one side and the other side forms the active part 33*a* capable of performing piezoelectric deformation corresponding to the pressure chamber 34A or 34B belonging to the first row or the second row, and the half on another side forms the inactive part 33*b* incapable of performing piezoelectric deformation corresponding to the partition 37 for isolating the pressure chamber 34A or 34B belonging to the second row or the first row. Namely, in the arrangement direction of the plurality of piezoelectric vibrators 33, the arrangement of the active parts 33*a* and the inactive parts 33*b* are alternately changed left or right and in the adjacent piezoelectric vibrators 33, the arrangement of the active parts 33*a* and the inactive parts 33*b* is opposite.

In FIGS. 4 and 5, numeral 43 indicates individual electrode layers formed by the electrode layers on the drive voltage input side and numeral 44 indicates common electrode layers formed by the electrode layers on the reference potential side. Between the individual electrode layers 43 and the common electrode layers 44, the piezoelectric material layers 49 are arranged. Each of the individual electrode layers 43 is exposed on one side (the side on the right of FIGS. 4 and 5) of each of the piezoelectric vibrators 33 and each of individual external electrodes 45 is electrically connected to the exposed part of each of the individual electrode layers 43. Further, the common electrode layer 44 of each of the piezoelectric vibrators 33 is exposed on the other side (the side on the left of FIGS. 4 and 5) of each of the piezoelectric vibrators 33 and each of common external electrodes 46 is electrically connected to the exposed part of each of the common electrode layers 44. The common external electrodes 46 are electrically connected commonly to all the common electrode layers 44 of the plurality of piezoelectric vibrators 33.

As FIG. 4 shows, the active parts 33*a* corresponding to the nozzle openings 23A and the pressure chambers 34A in the first row include the short individual electrode layers 43 extending from one side (the side on the right of FIG. 4) of the piezoelectric actuator unit 29 to the inside of the piezoelectric vibrators 33 in the width direction (the lateral direction of FIG. 4) and the long common electrode layers 44 extending from the other side (the side on the left of FIG. 4) of the piezoelectric actuator unit 29 to the inside of the piezoelectric vibrators 33 in the width direction.

On the other hand, as FIG. 5 shows, the active parts 33*a* corresponding to the nozzle openings 23B and the pressure chambers 34B in the second row include the long individual electrode layers 43 extending from one side (the side on the right of FIG. 5) of the piezoelectric actuator unit 29 to the inside of the piezoelectric vibrators 33 in the width direction (the lateral direction of FIG. 5) and the short common electrode layers 44 extending from the other side (the side on the left of FIG. 5) of the piezoelectric actuator unit 29 to the inside of the piezoelectric vibrators 33 in the width direction.

On the upper part of the plurality of piezoelectric vibrators 33, a fixing substrate 47 is installed and the plurality of piezoelectric vibrators 33 which are separated and formed independently are integrally fixed by the fixing substrate 47. The fixing substrate 47 is formed by free cutting ceramics.

Further, as shown in FIG. 2, the fixing substrate 47 is connected to the inner surface of the case 20 via the piezoelectric actuator unit substrate 30. However, as described later, in this embodiment, there is no need to receive the reaction force of the piezoelectric vibrators 33 by the case 20 at the time of driving, so that it is not necessary to strongly fix the piezoelectric actuator unit substrate 30 to the case 20.

As shown in FIGS. 4 and 5, the common external electrodes 46 pass on the top of the fixing substrate 47 and are pulled out on the same side as that of the individual external electrodes 45. Therefore, the individual external electrodes 45 and common external electrodes 46 of the plurality of piezoelectric vibrators 33 can be all electrically connected to the tape carriage package (a kind of the external drive means) 32 on one side (the side on the right of FIGS. 4 and 5) of the piezoelectric actuator unit 29. By doing this, the complication of wiring due to an increase in the number of nozzles can be avoided.

In the recording head 12 in this embodiment, the face of the elastic plate 26 on the side of the piezoelectric actuator unit 29, in the periphery of each of the plurality of elastic walls 26*a*, is connected only to the piezoelectric actuator unit 29 instead of the case 20. Therefore, the force generated when the piezoelectric vibrators 33 are driven forms a loop without passing through the case 20. Namely, there is no need to receive the reaction force of the piezoelectric vibrators 33 by the case 20 at the time of driving. Therefore, the structural strength required for the case 20 can be controlled low, thereby the degree of freedom of selection of the material and structure of the case 20 is increased.

As FIG. 7 shows, the length of the insular fixed thick parts 40 formed in correspondence with the partitions 37 is longer than the length of the insular movable thick parts 38 formed in correspondence with the pressure chambers 34A and 34B. Further, as FIG. 3 shows, the elastic walls 26a have the parts corresponding to the insular movable thick parts 38 and the thin parts (compliance parts) 39 formed around the insular movable thick parts 39. The outer contours of the thin parts (compliance parts), in the arrangement direction of the plurality of nozzle openings 23A (or 23B), are defined by the insular fixed thick parts 40 formed in correspondence with the partitions 37 and in the direction perpendicular to the arrangement direction of the plurality of nozzle openings 23A (or 23B), as FIG. 2 shows, are defined by a part 34' of the side walls of the pressure chambers 34A (34B) and the ink feed port 36.

As FIG. 8 shows, in the recording head 12 of this embodiment, the piezoelectric vibrators 33 in one row correspond to the nozzle openings 23A and 23B (and the pressure chambers 34A and 34B) in two rows and the constitution is different from that of a conventional recording head in which each of the respective piezoelectric vibrator rows is arranged for each nozzle row.

Figure 9:
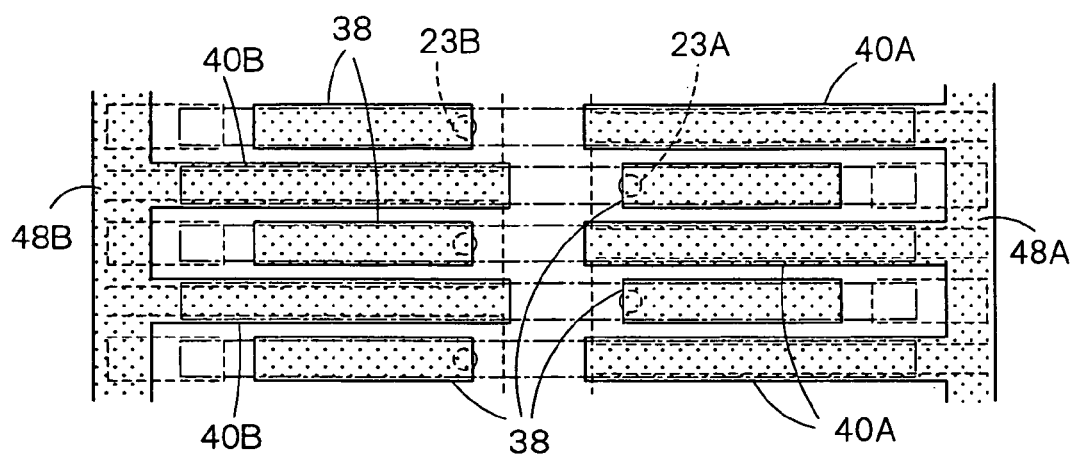
FIG. 9 is a drawing showing a modified example of the arrangement constitution of the fixed thick parts of the recording head shown in FIG. 7.

Further, as a modified example of the constitution of the fixed thick parts 40, as shown in FIG. 9, in correspondence with the partitions 37 for isolating the plurality of pressure chambers 34A and 34B, a plurality of insular fixed thick parts 40A and 40B to which the respective inactive parts 33b of the plurality of piezoelectric vibrators 33 are connected are formed, and the peninsular fixed thick parts 40A corresponding to the first row are connected by a first thick base 48A, and the peninsular fixed thick parts 40B corresponding to the second row are connected by a second thick base 48B. The first thick base 48A and the second thick base 48B are formed on the side opposite to the side where the nozzle openings 23A and 23B are formed with respect to the pressure chambers 34A and 34B.

In the example shown in FIG. 9, the elastic plate 26 is supported by the first thick base 48A and the second thick base 48B from the above, so that the elastic plate 26 can seal the flow path forming plate 25 more surely. Further, the first thick base 48A and the second thick base 48B function as a contact part of a jig used for adhering the elastic plate 26 to the flow path forming plate 25, so that at the time of adhesion, uniform and sufficient pressure can be ensured.

Next, the manufacturing method for the piezoelectric actuator unit 29 of the present embodiment will be explained by referring to FIGS. 10A to 15B.

Figure 10A:
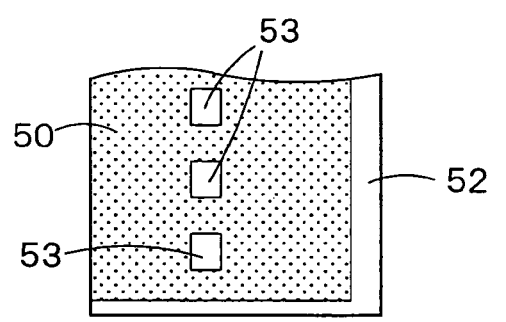
FIG. 10A is a drawing for explaining the manufacturing method of a piezoelectric actuator unit of an embodiment of the present invention, showing the piezoelectric material layer in which the first conductive material layers are laminated.
Figure 10B:
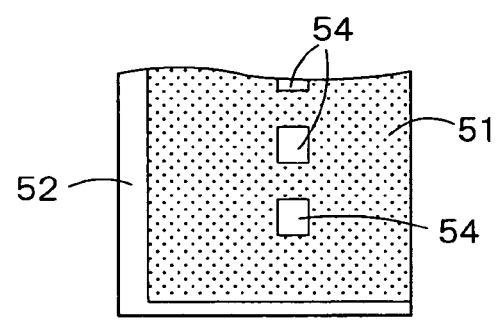
FIG. 10B is a drawing for explaining the manufacturing method of a piezoelectric actuator unit of an embodiment of the present invention, showing the piezoelectric material layer in which the second conductive material layers are laminated.
Figure 11A:
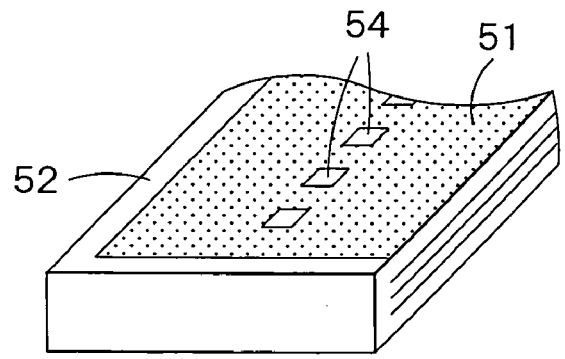
FIG. 11A is a drawing for explaining the manufacturing method of a piezoelectric actuator unit of an embodiment of the present invention, showing the lamination step on the way.
Figure 11B:
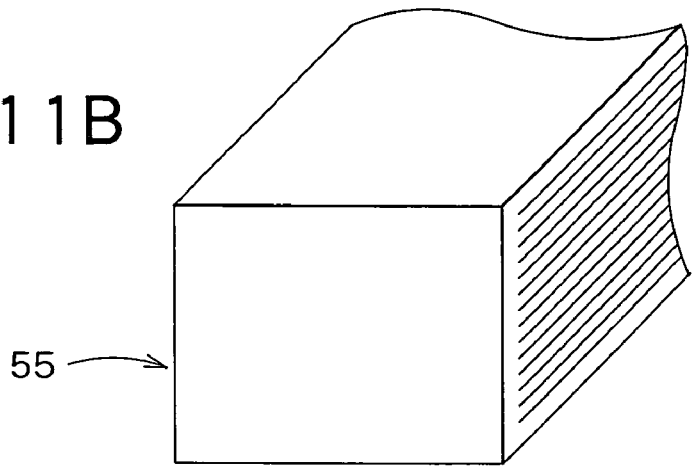
FIG. 11B is a drawing for explaining the manufacturing method of a piezoelectric actuator unit of an embodiment of the present invention, showing the end state of the lamination step.

Firstly, the first conductive material layer 50 (FIG. 10A) for forming the common electrode layers 44 of the plurality of piezoelectric vibrators 33 and the second conductive material layer 51 (FIG. 10B) for forming the individual electrode layers 43 of the plurality of piezoelectric vibrators 33 are alternately laminated and calcined while sandwiching the piezoelectric material layers 52 for forming the piezoelectric material layers 49 of the plurality of piezoelectric vibrators 33 (FIG. 11A) to form a laminate 55 (FIG. 11B).

As shown in FIG. 10A, in the first conductive material layer 50, a plurality of first windows 53 arranged at a predetermined pitch in the first window row in the arrangement direction of the plurality of piezoelectric vibrators 33 are formed. Further, as shown in FIG. 10B, in the second conductive material layer 51, a plurality of second windows 54 arranged at the same pitch as that of the first windows 53 in the second window row parallel with the first window row are formed. The first windows 53 and the second windows 54 are staggered from each other by the distance of a half of the predetermined pitch.

Figure 12:
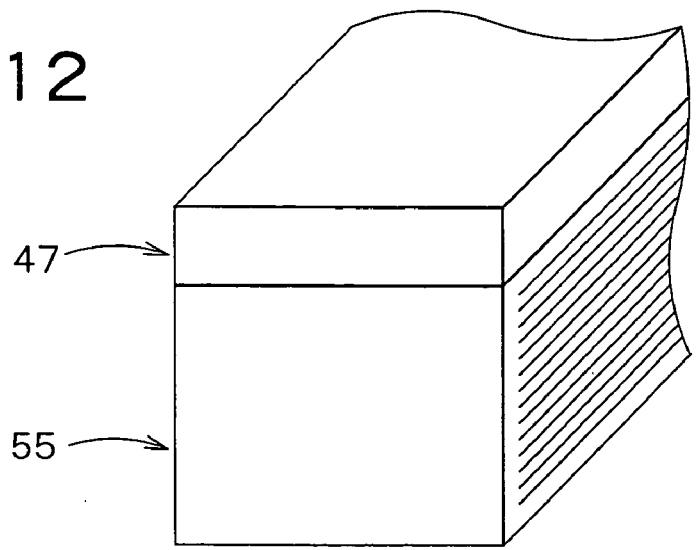
FIG. 12 is a drawing for explaining the manufacturing method of a piezoelectric actuator unit of an embodiment of the present invention, showing the state that the fixing substrate is joined to the laminate.

Next, as shown in FIG. 12, to one face (the upper face shown in FIG. 12) of the laminate 55 in the lamination direction of the first conductive material layers 50, the second conductive material layers 51, and the piezoelectric material layers 52, the fixing substrate 47 is joined. As described already, the fixing substrate 47 is formed by fee-cutting ceramics. When a part of the piezoelectric actuator unit 29 is formed by a member different from that of the laminate 55, expenses for expensive piezoelectric materials and electrode materials can be reduced.

Figure 13:
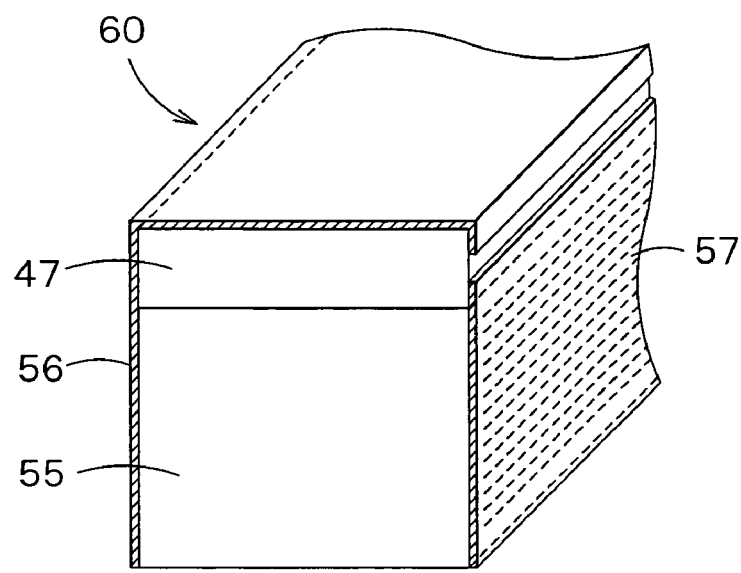
FIG. 13 is a drawing for explaining the manufacturing method of a piezoelectric actuator unit of an embodiment of the present invention, showing the state that the first and second external conductive material layers are formed on the laminate and fixing substrate.

Next, as shown in FIG. 13, on one face of the laminate 55 in the vibrator width direction perpendicular to both the lamination direction of the laminate 55 and the arrangement direction of the plurality of piezoelectric vibrators 33, second external conductive material layers 57 connected to the second conductive material layers 51 are formed. On the other hand, on the other face of the laminate 55 in the vibrator width direction, first external conductive material layers 56 connected to the first external conductive material layers 50 are formed and the first external conductive material layers 56 are pulled out and extended up to one face of the laminate 55 in which the second external conductive material layers 57 are formed passing on the top of the fixing substrate 47. By doing this, a piezoelectric structural body 60 which is a base material structure for manufacturing the piezoelectric actuator unit 29 is formed.

Figure 14:
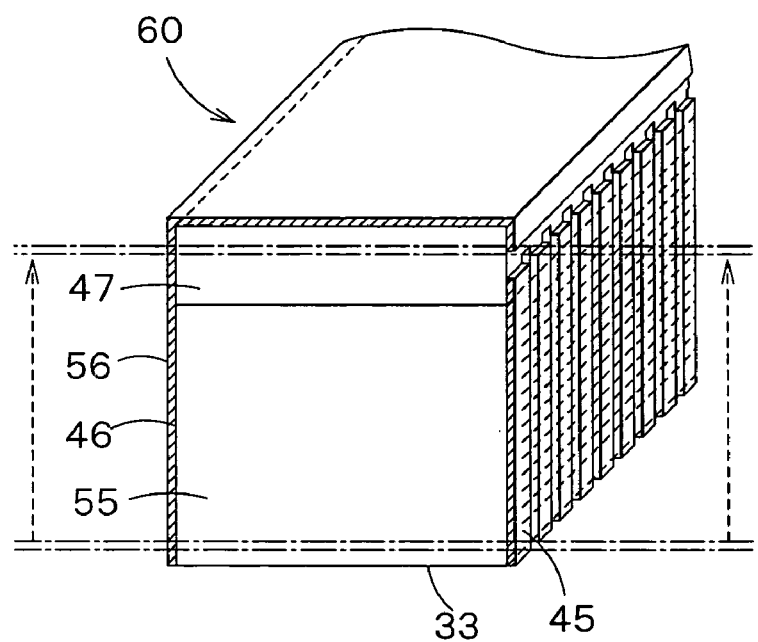
FIG. 14 is a drawing for explaining the manufacturing method of a piezoelectric actuator unit of an embodiment of the present invention, showing the state that a plurality of notches are formed in the first and second external conductive material layers and also in the laminate and fixing substrate.

Next, as shown in FIG. 14, a plurality of notches are formed in the laminate 55 composed of the first and second external conductive material layers 57 in the lamination direction, thereby a plurality of piezoelectric vibrators 33 are formed. The notch depth at this time is such that the fixing substrate 47 is cut in halfway. Namely, the laminate 55 composed of the first and second conductive material layers 50 and 51 and the piezoelectric material layers 52 is cut in throughout vertically, thereby a structure in which the piezoelectric vibrators 33 are independent from each other is obtained.

Further, at the cutting-in step, as shown in FIGS. 15A and 15B, each of the plurality of notches is formed in the position covering both each end of the first windows in the arrangement direction of the plurality of piezoelectric vibrators 33 and each end of the second windows in the above arrangement direction. Therefore, simultaneously with forming of the notches, the common electrode layers 44 and the individual electrode layers 45 (refer to FIGS. 4 and 5) are formed in a predetermined length. Incidentally, in FIGS. 4 and 5, the electrode layers which do not contribute to driving of the piezoelectric vibrators 33 are omitted.

Further, for the convenience of positioning at the time of cutting in, the first conductive material layers 50 or the second conductive material layers 51 are formed also on the end face (the bottom of the laminate 55) of the laminate 55 corresponding to the tips of the plurality of piezoelectric vibrators 33 and can be used as an index of positioning at the time of cutting in the laminate 55. Particularly, it is effective in a case that the size of the laminate 55 is changed at the time of calcination.

Finally, the tape carrier package 32 which is an external drive means for driving the plurality of piezoelectric vibrators 33 is connected, on one face of the laminate 55, to all the individual external electrodes 45 and the common external electrodes 46 of the plurality of piezoelectric vibrators 33. Since the tape carrier package 32 can be connected on one face of the laminate 55 like this, the wiring operation can be made easily and the wiring of the recording head 12 can be simplified.

As mentioned above, according to this embodiment, from one bulk of laminate 55 formed by laminating the piezoelectric material layers 52 and the electrode layers 50 and 51, the piezoelectric actuator unit 29 is formed, and the piezoelectric vibrators 33 in one row formed by the piezoelectric actuator unit 29 can correspond to two nozzle rows (and two pressure chamber rows), so that the number of nozzles of the recording head 12 can be increased free of an excessive increase in the manufacturing cost and complication of wiring. On the other hand, when manufacturing an ink jet recording apparatus using a conventional piezoelectric actuator unit, piezoelectric actuator units as many as the number of nozzle rows (pressure chamber rows) are necessary and/or tape carriage packages (drive integrated circuit) as many as the number of nozzle rows (pressure chamber rows) are necessary.

Further, in this embodiment, above the partition 37 between the adjacent pressure chambers 34A and 34B in the arrangement direction of the piezoelectric vibrators 33, the inactive part 33b of the piezoelectric vibrator 33 is joined, so that when the piezoelectric vibrator 33 is driven and the active part 33a thereof is deformed, the inactive part 33b of the piezoelectric vibrator 33 positioned on both sides of the driven piezoelectric vibrator 33 prevents the flow path unit 21 from deformation. The piezoelectric actuator unit 29 itself functions as a strength member for preventing deformation of the flow path unit 21 like this, so that the cross talk during printing, particularly the cross talk when driving all the piezoelectric vibrators 33 in the first row (or the second row) at the same time can be effectively prevented. Therefore, there is little need to prevent deformation of the flow path unit 21 due to the rigidity of the case 20, and the degree of freedom of selection of the material and structure of the case 20 is increased.

In the aforementioned embodiment, the constitution in which one piezoelectric actuator unit 29 is arranged in correspondence with two nozzle rows is explained. As a modified example, a plurality of piezoelectric actuator units 29 are provided and a plurality of sets composed of the first row and second row formed by a plurality of nozzle openings 23A and 23B and a plurality of pressure chambers 34A and 34B can be provided in correspondence with the respective piezoelectric actuator units 29.

As shown in FIG. 2, the tape carriage package 32 is pulled out vertically, so that even when the number of piezoelectric actuator units 29 to be set is increased as mentioned above, the wires can be easily laid. Even in this modified example, one piezoelectric actuator unit 29 can correspond to two nozzle rows, so that the same effect as that of the aforementioned embodiment can be obtained.

Figure 17:
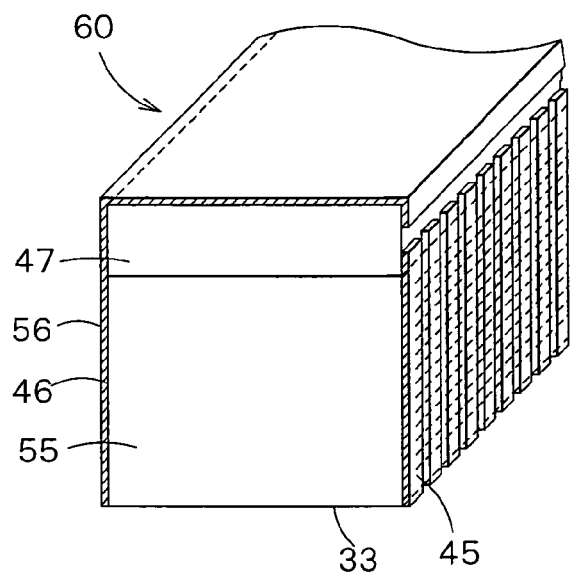
FIG. 17 is a perspective view showing a piezoelectric actuator unit as a modified example of the embodiment shown in FIG. 14.
Figure 18:
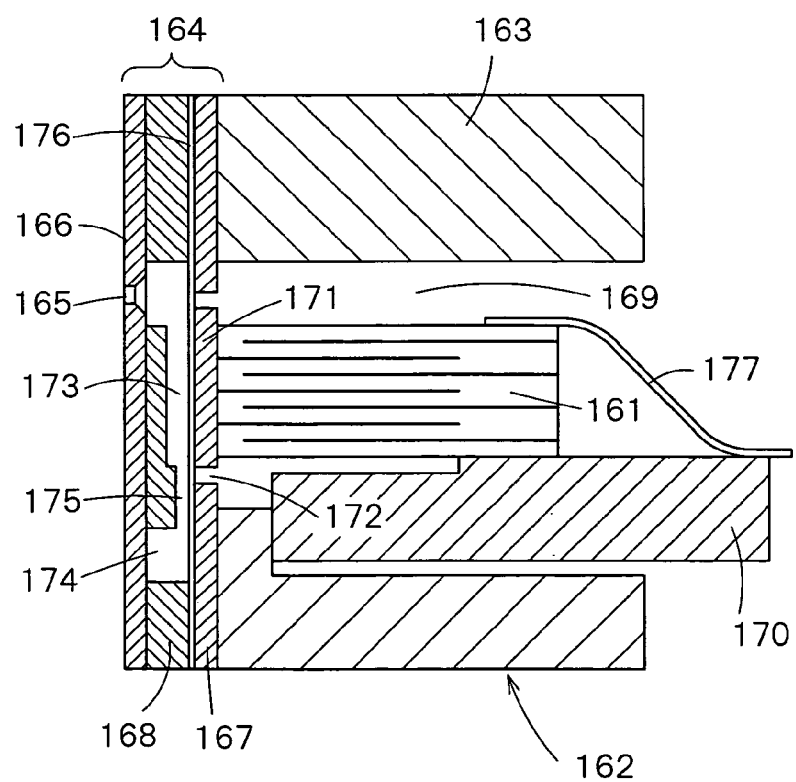
FIG. 18 is a sectional view showing the recording head of a conventional ink jet recording apparatus.

Next, a modified example of the aforementioned embodiment will be explained by referring to FIGS. 16A and 16B and FIG. 17.

In the aforementioned embodiment, as shown in FIG. 14, the notches are formed in the laminate 55 in the lamination direction and the piezoelectric vibrators 33 are physically separated from each other. On the other hand, in this embodiment, as shown in FIG. 17, the piezoelectric vibrators 33 are not separated from each other.

In this embodiment, the plurality of piezoelectric vibrators 33 are respectively individualized and formed by the overlapped parts of the common electrode layers 44 on the reference potential side which are formed by the first conductive material layers 50 shown in FIG. 16A and the individual electrode layers 43 on the drive voltage input side which are formed by the second conductive material layers 51 shown in FIG. 16B in the lamination direction.

Namely, the piezoelectric vibrators 33 are not separated physically by cutting in but the piezoelectric vibrators 33 are separated in terms of material by arranging inactive walls incapable of performing piezoelectric deformation between the piezoelectric vibrators 33. In other words, via the inactive walls incapable of performing piezoelectric deformation which are arranged between the piezoelectric vibrators 33, the plurality of piezoelectric vibrators 33 are integrally formed without being physically separated from each other.

An example of the recording head 12 which is a kind of liquid ejecting head is used above for explanation. However, the present invention can be applied to other kind of liquid ejecting head such as a liquid crystal ejecting head or a coloring material ejecting head or also to a piezoelectric actuator unit used for these liquid ejecting heads. Further, the present invention can be applied also to a piezoelectric actuator unit used for various apparatuses such as a micropump.

In the aforementioned embodiments, an example of the ink jet recording apparatus which is a kind of liquid ejecting apparatus is explained. However, the present invention can be applied also to a liquid ejecting apparatus having other liquid ejecting heads such as a liquid crystal ejecting head or a coloring material ejecting head.

The preferred embodiments of the present invention are described above in detail to a certain degree. However, it is clear that many changes and modifications can be made. Therefore, it can be understood that without being deviated from the scope and spirit of the present invention, in configurations other than those specifically described here, the present invention can be executed.

What is claimed is:

1. A piezoelectric actuator unit comprising: a plurality of piezoelectric vibrators formed by alternately laminating electrode layers and piezoelectric material layers so as to vibrate in a lamination direction of said layers, wherein:

said plurality of piezoelectric vibrators are arranged in one row in a direction of vibrator arrangement perpendicular to said lamination direction, each piezoelectric vibrator includes an area on one side and an area on the other side in a vibrator width direction perpendicular to both said lamination direction and said vibrator arrangement direction, either of said area on one side and said area on the other side forms an active part capable of performing piezoelectric deformation, and the other area forms an inactive part incapable of performing piezoelectric deformation, an arrangement of said active part and said inactive part is opposite between adjacent piezoelectric vibrators, each piezoelectric vibrator has an individual electrode layer on a drive voltage input side, and all of said individual electrode layers of said plurality of piezoelectric vibrators are exposed on one side of said piezoelectric actuator unit in said vibrator width direction.

2. A piezoelectric actuator unit according to claim 1, wherein:

said plurality of piezoelectric vibrators respectively further include common electrode layers on a reference potential side, and all of said common electrode layers of said plurality of piezoelectric vibrators are exposed on the other side of said piezoelectric actuator unit in said vibrator width direction.

3. A piezoelectric actuator unit according to claim 1 or 2, further comprising external drive means configured to drive said plurality of piezoelectric vibrators, and
   all of said individual electrode layers of said plurality of piezoelectric vibrators are electrically connected to said external drive means on one side of said piezoelectric actuator unit.

4. A piezoelectric actuator unit according to claim 2, further comprising:
   a plurality of individual external electrodes which are exposed on one side of said piezoelectric actuator unit and electrically connected to respective said individual electrode layers of said plurality of piezoelectric vibrators, and
   a common external electrode which is exposed on the other side of said piezoelectric actuator unit and electrically connected to all of said common electrode layers of said plurality of piezoelectric vibrators,
   wherein said common external electrode is pulled out on the same side as that of said individual external electrodes.

5. A piezoelectric actuator unit according to claim 1, wherein via an inactive wall incapable of performing piezoelectric deformation and extending overall in said vibrator width direction between said piezoelectric vibrators, said plurality of piezoelectric vibrators are integrally formed without being separated from each other.

6. A piezoelectric actuator unit according claim 1, wherein:
   respective said plurality of piezoelectric vibrators are formed independently, and
   said plurality of piezoelectric vibrators are integrally fixed by a fixing substrate arranged on one side of said actuator unit in the lamination direction.

7. A piezoelectric actuator unit according to claim 6, wherein said fixing substrate is formed by free-cutting ceramics.

8. A piezoelectric actuator unit according to claim 6, further comprising a piezoelectric actuator unit substrate for holding said fixing substrate.

9. A piezoelectric actuator unit according to claim 8, further comprising a tape carrier package electrically connected to said electrode layers of said plurality of piezoelectric vibrators, wherein said tape carrier package includes an integrated circuit for driving said plurality of piezoelectric vibrators, and a rear of said integrated circuit is at least partially fixed to said piezoelectric actuator unit substrate.

* * * * *